United States Patent [19]

Maydan et al.

[11] 4,383,885
[45] May 17, 1983

[54] REACTIVE SPUTTER ETCHING OF POLYSILICON UTILIZING A CHLORINE ETCH GAS

[75] Inventors: Dan Maydan, Short Hills; David N. Wang, Warren Township, Somerset County, both of N.J.

[73] Assignee: Bell Telephone Laboratories, Incorporated, Murray Hill, N.J.

[21] Appl. No.: 300,307

[22] Filed: Sep. 8, 1981

Related U.S. Application Data

[63] Continuation of Ser. No. 119,103, Feb. 6, 1980, abandoned.

[51] Int. Cl.³ ......................................... H01L 21/308
[52] U.S. Cl. .................................. 156/643; 156/646; 156/657; 156/662; 204/192 E
[58] Field of Search ............. 156/643, 657, 646, 662, 156/345; 204/192 E

[56] References Cited

U.S. PATENT DOCUMENTS

| | | |
|---|---|---|
| 3,971,684 | 2/1976 | Muto .................. 156/643 |
| 4,104,086 | 8/1978 | Bondur et al. ........... 156/662 |
| 4,214,946 | 7/1980 | Forget et al. ........... 156/657 |
| 4,268,374 | 5/1981 | Lepselter ............... 156/345 |

OTHER PUBLICATIONS

Eames et al., "Method for ... Etching", IBM Technical Disclosure Bull., vol. 22, No. 7 (12/79), p. 2739.
Vossen, "Glow Discharge ... Deposition", J. Electrochemical Society, vol. 126, No. 2, (2/79), pp. 319–320.

*Primary Examiner*—Jerome W. Massie
*Attorney, Agent, or Firm*—Lucian C. Canepa

[57] ABSTRACT

In a chlorine plasma, reactive sputter etching of monocrystalline silicon, undoped polycrystalline silicon or doped polycrystalline silicon is achieved. The etching processes are substantially free of any loading effects and are characterized by high resolution, excellent uniformity and high selectivity with respect to, for example, silicon dioxide. For silicon and undoped polysilicon, the edge profile of the etched material is anisotropic. For doped polysilicon, the edge profile can be controlled to occur anywhere in the range from completely isotropic to completely anisotropic.

9 Claims, 3 Drawing Figures

REACTIVE SPUTTER ETCHING OF POLYSILICON UTILIZING A CHLORINE ETCH GAS

This is a continuation, of application Ser. No. 119,103, filed Feb. 6, 1980, now abandoned.

BACKGROUND OF THE INVENTION

This invention relates to the fabrication of microminiature devices such as integrated circuits and, more particularly, to the delineation of fine-line patterns in such devices by dry etching processes.

Considerable interest exists in employing dry processing techniques for patterning workpieces such as semiconductor wafers. The interest in such techniques stems from their generally better resolution and improved dimensional and shape control capabilities relative to standard wet etching. Thus, dry etching is being utilized increasingly for pattern delineation in the processing of, for example, semiconductor wafers to form large-scale-integrated (LSI) devices.

Various dry etching processes that involve the use of gaseous plasmas are known, as described, for example, in "Plasma-Assisted Etching for Pattern Transfer" by C. J. Mogab and W. R. Harshbarger, *J. Vac. Sci. & Tech.*, 16 (2), March/April 1979, p. 408. As indicated therein, particular emphasis in recent work has been directed at developing processes that utilize reactive gas plasmas in a mode wherein chemical reactions are enhanced by charged particle bombardment. One advantageous such process, designated reactive sputter (or ion) etching, is described in the aforecited Mogab-Harshbarger article and in *Proc. 6th Int'l Vacuum Congr.* 1974, *Japan. J. Appl. Phys.*, suppl. 2, pt. 1, pp. 435–438, 1974.

Considerable effort has been directed recently at trying to devise reliable reactive sputter etching processes for fine-line pattern delineation in silicon surfaces. Of particular practical interest has been the work directed at etching polysilicon. Polysilicon films, both doped and undoped, constitute constituent layers of commercially significant LSI devices such as 64K dynamic random-access-memories (RAMs) of the metal-oxide-semiconductor (MOS) type. Accordingly, it was recognized that improved methods of patterning silicon by reactive sputter etching, if available, could contribute significantly to decreasing the cost and improving the performance of such devices and other structures that include silicon substrates or layers.

SUMMARY OF THE INVENTION

Hence, an object of the present invention is an improved dry etching process. More specifically, an object of this invention is an improved reactive sputter etching process for silicon.

Briefly, these and other objects of the present invention are realized in a specific illustrative embodiment thereof in which reactive sputter etching of monocrystalline silicon and doped or undoped polycrystalline silicon is achieved in a chlorine plasma under relatively low power and low pressure conditions. For monocrystalline silicon and undoped polycrystalline silicon, the edge profile of the etched layer is anisotropic. For doped polycrystalline silicon, the edge profile can be controlled to occur anywhere in the range from completely isotropic to completely anisotropic.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
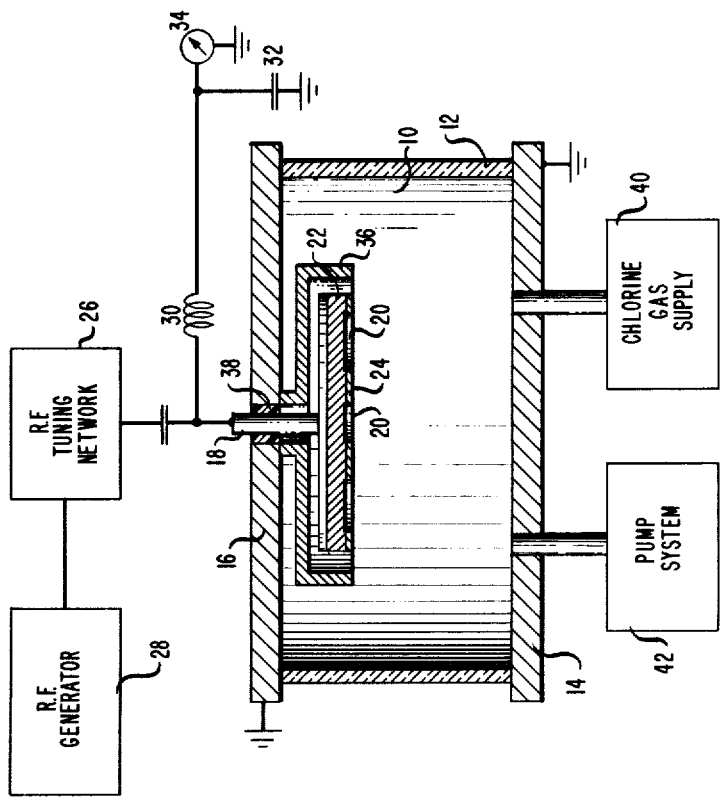
FIG. 1 is a schematic depiction of a specific illustrative parallel-plate reactor of the type in which the processes of the present invention can be carried out.

In accordance with the principles of the present invention, reactive sputter etching is carried out in, for example, a parallel-plate reactor of the type depicted in FIG. 1 or in a so-called multifaceted reactor of the type shown in a copending commonly assigned application of D. Maydan designated application Ser. No. 105,620, filed Dec. 20, 1979, now U.S. Pat. No. 4,298,443.

The particular illustrative parallel-plate reactor shown in FIG. 1 comprises an etching chamber 10 defined by a cylindrical nonconductive member 12 and two conductive end plates 14 and 16. Illustratively, the member 12 is made of glass and the plates 14 and 16 are each made of aluminum. In addition, the depicted reactor includes a conductive workpiece holder 18 also made, for example, of aluminum. In one illustrative case, the bottom of the holder 18 constitutes a 10-inch circular surface designed to have seven 3-inch wafers placed thereon.

Wafers 20, whose bottom (i.e., front) surfaces are to be etched, are indicated in FIG. 1 as being mounted on the bottom surface of a plate 22. The plate 22 is designed to be secured to the holder 18 by any suitable standard instrumentality (not shown) such as clamps or screws. In accordance with one feature of the present invention, the plate 22 is made of a conductive material such as aluminum and the top or back surfaces of the wafers 20 are maintained in electrical contact therewith.

The wafers 20 of FIG. 1 are maintained in place on the plate 22 by a cover plate 24 having apertures therethrough. The apertures are positioned in aligned registry with the wafers 20 and are each slightly smaller in diameter than the respectively aligned wafers. In that way, a major portion of the front surface of each wafer is exposed for etching. By any standard means, the cover plate 24 is secured to the plate 22.

Advantageously, the cover plate 24 included in the etching apparatus of FIG. 1 is made of a low-sputter-yield material that does not react chemically with the etching gas to form a nonvolatile material. Suitable such materials include anodized aluminum and fused silica.

The workpiece holder 18 shown in FIG. 1 is capacitively coupled via a radio-frequency tuning network 26 to a radio-frequency generator 28 which, by way of example, is designed to drive the holder 18 at a frequency of 13.56 megahertz. Further, the holder 18 is connected through a filter network, comprising an inductor 30 and a capacitor 32, to a meter 34 that indicates the peak value of the radio-frequency voltage applied to the holder 18.

In FIG. 1, the end plate 14 is connected to a point of reference potential such as ground. The plate 14 is the anode of the depicted reactor. The workpiece holder 18 constitutes the driven cathode of the reactor. In one specific illustrative reactor of the type shown in FIG. 1, the anode-to-cathode separation was approximately 10 inches and the diameter of the anode plate was approximately 17 inches.

The end plate 16 of the FIG. 1 arrangement is also connected to ground. Additionally, an open-ended cylindrical shield 26 surrounding the holder 18 is connected to the plate 16 and thus to ground. The portion of the holder 18 that extends through the plate 16 is electrically insulated therefrom by a nonconductive bushing 38.

In accordance with the principles of the present invention, a chlorine gas atmosphere is established in the chamber 10 of FIG. 1. Chlorine gas is controlled to flow into the indicated chamber from a standard supply 40. Additionally, a prescribed low pressure condition is maintained in the chamber by means of a conventional pump system 42.

By introducing chlorine gas into the chamber 10 (FIG. 1) and establishing an electrical field between the anode 14 and the cathode 18, as specified in particular detail below, a reactive plasma is generated in the chamber 10. The plasma established therein is characterized by a uniform dark space in the immediate vicinity of the workpiece surfaces to be etched. Volatile products formed at the workpiece surfaces during the etching process are exhausted from the chamber by the system 42.

Figure 2:
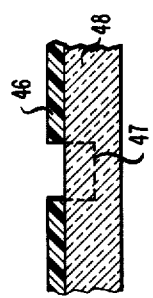
FIG. 2 is a cross-sectional representation of a masked monocrystalline silicon member that is capable of being etched in accordance with this invention.

FIG. 2 is a cross-sectional depiction of a portion of one of the wafers 20 to be etched in the chamber 10 of FIG. 1. In FIG. 2, a conventionally patterned masking layer 46 is shown formed on a substrate 48 made of monocrystalline silicon which, for example, is either p- or n-doped to exhibit a resistivity of approximately 1-to-10 ohm-centimeters. In accordance with the principles of the present invention, the unmasked portions of the silicon substrate 48 are removed in a reactive sputter etching process to form vertically walled features therein exhibiting virtually no undercutting relative to the overlying masking layer 46. As indicated in FIG. 2 by dashed lines 47, such anisotropic etching of the substrate 48 forms therein a precisely defined channel.

The ability to anisotropically etch features in monocrystalline silicon is of practical importance in connection with the fabrication of microminiature electronic devices. Thus, for example, the aforespecified channel formed in the substrate 48 of FIG. 2 represents, for example, one step in the process of fabricating a microminiature MOS capacitor. Other device structures that require the anisotropic etching of a substrate or layer of monocrystalline silicon during the fabrication thereof are known in the art.

Anisotropic etching of both doped and undoped polysilicon layers is of significant importance in the fabrication of LSI devices. Thus, for example, in making MOS RAMs it is typically necessary at different steps in the fabrication sequence to precisely pattern thin layers of doped and undoped polysilicon.

Figure 3:
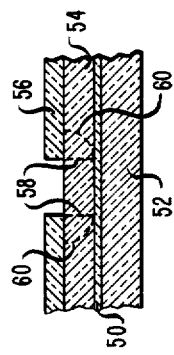
FIG. 3 is a cross-sectional representation of a masked polycrystalline silicon layer to be etched in accordance with the present invention.

FIG. 3 represents in cross-section a portion of an MOS RAM device structure that includes a polysilicon layer to be etched. In FIG. 3, a thin (for example, 500-Angstrom-unit) layer 50 of silicon dioxide is shown on a monocrystalline silicon member 52. On top of the layer 50 is a layer 54 of polycrystalline silicon. Illustratively, the layer 54 is about 5000 Angstrom units thick. On top of the layer 54 to be etched is a conventionally patterned masking layer 56.

FIG. 3 is to be considered a generic depiction of different portions of the same memory device. In some portions of the device being fabricated, the layer 54 is made of doped polysilicon and is commonly referred to as the poly 1 level, as is well known in the art. In other portions of the same device, the layer 54 is made of undoped polysilicon. This undoped layer is commonly referred to as the poly 2 level.

In accordance with the principles of the present invention, anisotropic etching of layers of either doped or undoped polysilicon is achieved. Anisotropic etching of the layer 54 of FIG. 3 is represented therein by vertical dashed lines 58. But, in accordance with this invention, it is also feasible to achieve isotropic etching of doped polysilicon layers. A completely isotropic profile is represented by curved dashed lines 60 in FIG. 3. Moreover, in accordance with a feature of this invention, it is possible to selectively control the etching of a doped polysilicon layer to achieve an edge profile therein intermediate the completely anisotropic and completely isotropic cases illustrated in FIG. 3.

Herein, the term "doped" polysilicon is intended to refer to a polysilicon layer to which a p dopant such as phosphorous has been added. Illustratively, the dopant concentration in such a layer is controlled to establish a resistivity therein in the range 20-to-100 ohm-centimeters.

In accordance with the principles of this invention, various materials are suitable for forming the patterned masking layers 46 and 56 shown in FIGS. 2 and 3. These materials include organic or inorganic resists, silicon dioxide, magnesium oxide, aluminum oxide, titanium, tantalum, tungsten oxide, cobalt oxide, and the refractory silicides of titanium, tantalum and tungsten. Masking layers made of these materials are patterned by utilizing standard lithographic and etching techniques.

In accordance with this invention, reactive sputter etching of monocrystalline silicon and doped or undoped polycrystalline silicon is carried out in a chlorine gas atmosphere. In a preferred embodiment, the atmosphere established in the etching chamber comprises essentially pure chlorine. Typically, as a practical matter, this means that chlorine gas having a purity of, for example, approximately 95-to-99.5 volume percent is the sole constituent purposely introduced into the chamber. Under the particular process conditions specified herein, such a pure chlorine gas atmosphere is characterized by a relatively high etching rate for silicon. Moreover, the selectivity therein between the silicon to be etched and other layers (such as the masking layer and other layers in the device structure made, for example, of silicon dioxide) is relatively high. In addition, the use of only chlorine gas as the medium introduced into the chamber is generally preferred because of the relative simplicity of handling and controlling a one-gas supply.

But, in accordance with the principles of the present invention, constituents other than chlorine may also be added to the reaction chamber to achieve controlled etching of silicon, provided that the herein-specified process conditions are maintained. In general, however, adding another constituent to chlorine decreases the differential etch rate between silicon and other materials such as silicon dioxide in the structure being processed.

Illustratively, the constituents that may be added to chlorine to carry out reactive sputter etching of silicon include argon or any other noble gas up to approximately 20-to-25 volume percent, or nitrogen up to approximately 20-to-25 volume percent, or helium up to approximately 50 volume percent.

In accordance with the principles of this invention, etching can be carried out in, for example, a parallel-plate reactor of the type shown in FIG. 1 or in a multifaceted reactor of the type described in the aforecited Maydan application. For anisotropic etching in such equipment, in accordance with a specific illustrative example, a chlorine partial pressure of about 5 microns is established in the etching chamber. For a parallel-plate reactor of the particular type described, a chlorine gas flow into the etching chamber of, for example, approximately 10 cubic centimeters per minute is advantageous. For a multifaceted reactor of the type specified, a chlorine gas flow of, for example, approximately 30 cubic centimeters per minute is established.

In accordance with the invention, a power density of, for example, approximately 0.20 watts per square centimeter is established at the surface of the workpiece to be etched in a multifaceted reactor. For a parallel-plate reactor, the corresponding power density, for example, 0.25 watts per square centimeter.

For the particular conditions established in the aforespecified illustrative examples, monocrystalline silicon and undoped polycrystalline silicon were each anisotropically etched in the specified equipments at a rate of approximately 600 Angstrom units per minute. In either reactor, the corresponding anisotropic etch rate for doped polysilicon was about 1200 Angstrom units per minute.

To achieve anisotropic etching of a doped polysilicon layer as described herein, it is essential that the backside of the workpiece to be etched be maintained in good electrical contact with the driven cathode electrode during the etching process. Otherwise, isotropic etching of the doped polysilicon layer will result. For undoped polysilicon and monocrystalline silicon, however, anisotropic etching is achieved whether or not the backside of the workpiece electrically contacts the driven cathode electrode.

Anisotropic etching processes of the type specified above are characterized by a relatively high differential etch rate with respect to, for example, both silicon dioxide and standard resist materials such as HPR-204 (commercially available from Philip A. Hunt Chemical Corp. Palisades Park, N.J.). The aforespecified particular illustrative processes for monocrystalline silicon and undoped polysilicon etch silicon approximately 30 times faster than silicon dioxide and about three times faster than resist. The aforespecified particular illustrative process for doped polysilicon etches the polysilicon layer about 50 times faster than silicon dioxide and about six times faster than resist.

The above-specified particular examples of anisotropic reactive sputter etching are illustrative only. More generally, in accordance with the principles of the present invention, such etching can be carried out by selecting chlorine partial pressures, chlorine gas flows and power densities in the ranges 2-to-50 microns, 2-to-150 cubic centimeters per minute (with the exception that for etching in the herein-described multifaceted reactor, the gas flow must be at least 10 cubic centimeters per minute) and 0.03-to-2 watts per square centimeter, respectively.

As mentioned above, isotropic etching of doped polysilicon results if the backside of the workpiece to be etched is not maintained in electrical contact with the driven cathode electrode of the etching apparatus. Alternatively, in accordance with a feature of the principles of the present invention, isotropic etching of doped polysilicon is achieved while the backside of the workpiece is maintained in electrical contact with the driven cathode electrode. This is accomplished by establishing particular conditions in the etching chamber, as specified below. And, significantly, by changing these conditions, the etching process can be controlled to vary between completely isotropic and completely anisotropic.

In accordance with a specific illustrative example, completely isotropic reactive sputter etching of doped polysilicon in a chlorine gas atmosphere is achieved in a parallel-plate reactor by establishing therein a chlorine partial pressure of, for example, approximately 20 microns, a gas flow of approximately 10 cubic centimeters per minute and a power density of 0.125 watts per square centimeter. The corresponding figures in a multifaceted reactor are 20, 30 and 0.10, respectively. By varying these parameters between the values specified in this paragraph and those specified earlier above for anisotropic etching of doped polysilicon, the edge profile of the etched layer can be controlled to occur anywhere in the range between completely isotropic and completely anisotropic. Thus, for example, if these parameters are established at approximately 15 microns, 10 cubic centimeters per minute and 0.20 watts per square centimeter, an etching condition for doped polysilicon almost exactly intermediate completely isotropic and completely anisotropic is achieved. In this condition, the amount of undercutting (maximum lateral etch) is approximately half the vertical thickness of the etched layer.

The above-specified particular examples of isotropic reactive sputter etching of doped polysilicon are illustrative only. More generally, in accordance with the principles of the present invention, such etching can be carried out by selecting chlorine partial pressures, chlorine gas flows and power densities in the ranges 2-to-50 microns, 2-to-150 cubic centimeters per minute and 0.06-to-2 watts per square centimeter, respectively. In selecting particular values from these ranges to achieve isotropic, rather than anisotropic, etching or doped polysilicon, it is characteristic of each set of selected values that for a given power density there is a corresponding minimum or threshold pressures above which isotropic etching occurs. As the power density is increased, the corresponding threshold pressure for isotropic etching increases linearly. Or, for a given pressure, there is a maximum power density below which isotropic etching occurs.

In accordance with applicants' invention, the combination of a relatively low power density, a relatively low partial pressure of chlorine and an adequate flow of chlorine into the etching chamber are effective to provide a basis for an efficient etching reaction. It is hypothesized by applicants that in the herein-specified etching process ions incident on the workpiece to be etched activate chlorine species on the surface of the workpiece. In turn, chlorine so activated reacts with the material (silicon) to be etched to form volatile products that are removed from the etching chamber by the pumping system connected thereto. In practice, the flow of chlorine into the chamber is advantageously maintained above a threshold value. In that way, an adequate supply of the active species (chlorine) is provided, whereby a specified etching rate is achieved and maintained during the etching process.

The reactive sputter etching processes described herein are characterized by relatively low pressures and low power densities. Because of the low power densities specified herein, the processes do not cause any appreciable thermally induced distortions such as workpiece warpage or dimensional changes in the equipment itself. Additionally, the availability and design of radio-frequency generators for energizing the etching equipment is facilitated by the relatively low power requirements therefor.

Further, the processes described herein are characterized by a relatively high uniformity of etch rate across each workpiece as well as from workpiece to workpiece. In practice, such variations in etch rate have been determined not to exceed about ±2 percent.

Additionally, the processes of the present invention are characterized by the absence of any loading effects. (As is well known, loading is the dependence of etch time on the total surface area to be etched.) Moreover, the edge profile, the etch rate and the selectivity of each of those processes have been determined to be virtually independent of the specific pattern geometry, feature size and masking material involved in the etching operation.

Finally, it is to be understood that the above-described procedures are only illustrative of the principles of the present invention. In accordance with these principles, numerous modifications and alternatives may be devised by those skilled in the art without departing from the spirit and scope of the invention.

Hereinabove and hereinafter, in the claims, the term silicon is employed in a generic sense to encompass monocrystalline silicon, undoped polycrystalline silicon, and doped polycrystalline silicon.

We claim:

1. A method for fabricating a microminiature device in accordance with a process sequence that includes at least one step in which a doped polycrystalline silicon layer of the device is to be anisotropically etched in a reactive sputter etching apparatus that comprises a plasma established between an anode electrode and a cathode electrode which holds the device to be etched, the plasma resulting from imposition of an electric field across a gaseous environment established between said electrodes, wherein the gaseous environment comprises essentially pure chlorine, wherein in said apparatus a chlorine pressure of approximately 2-to-50 microns is established and in which apparatus the power density at the surface of the member being etched is set at approximately 0.30-to-2 watts per square centimeter, wherein said doped polycrystalline silicon layer includes on the top surface thereof to be etched a patterned masking layer, and wherein in the etching apparatus the bottom surface of said device is maintained in direct electrical contact with said cathode electrode.

2. A method for fabricating a microminiature device in accordance with a process sequence that includes at least one dry etching step in which a workpiece comprising a doped polysilicon layer having a patterned masking layer on the surface thereof is to be anisotropically etched in a reactive sputter etching apparatus that comprises a plasma established between spaced-apart electrodes only one of which holds a member to be etched and the other of which is grounded, said one electrode being smaller in area than the other electrode, said plasma resulting from imposition of an electric field across a gaseous environment introduced between said electrodes, said field resulting from the capacitive coupling of a radio-frequency source to said one electrode to dc bias said electrode to constitute the cathode electrode in said apparatus during the entirety of said etching step, wherein said gaseous environment comprises essentially pure chlorine, and wherein in the etching apparatus said workpiece including said doped polysilicon layer to be etched is maintained in direct electrical contact with said cathode electrode.

3. A method as in claim 2 wherein in said apparatus a chlorine pressure of approximately 2-to-50 microns is established and in which apparatus the power density at the surface of the member being etched is set at approximately 0.03-to-2 watts per square centimeter.

4. A method as in claim 3 wherein chlorine gas is flowed into said apparatus at a rate of approximately 2-to-150 cubic centimeters per minute.

5. In a device fabrication sequence, a method for anisotropically etching a layer of doped polysilicon disposed on a semiconductor member, said method comprising the steps of forming a patterned masking layer on the surface of said doped polysilicon layer, placing said member in direct electrical contact with one of two spaced-apart electrodes in the reaction chamber of a reactive sputter etching apparatus, establishing a gaseous atmosphere in the space between said electrodes, said atmosphere comprising at least approximately 50 volume percent chlorine and being characterized in that chlorine is the only source in said gaseous atmosphere of reactive etching species for the doped polysilicon layer, and applying an electric potential between said electrodes to activate said gaseous atmosphere to produce a plasma that contains reactive species that etch said doped polysilicon layer anisotropically.

6. A method as in claim 5 wherein said gaseous atmosphere comprises essentially pure chlorine.

7. A method as in claim 5 wherein said gaseous atmosphere comprises approximately 75-to-80 volume percent chlorine and a noble gas.

8. A method as in claim 5 wherein said gaseous atmosphere comprises approximately 75-to-80 volume percent chlorine and nitrogen.

9. A method as in claim 5 wherein said gaseous atmosphere comprises approximately 50 volume percent chlorine and helium.

* * * * *